(12) United States Patent
Cao

(10) Patent No.: US 12,347,400 B2
(45) Date of Patent: Jul. 1, 2025

(54) DISPLAY PANEL AND APPARATUS, CONTROL METHOD, AND CONTROL MODULE

(71) Applicant: ZTE CORPORATION, Guangdong (CN)

(72) Inventor: Li Cao, Guangdong (CN)

(73) Assignee: ZTE CORPORATION, Guangdong (CN)

( * ) Notice: Subject to any disclaimer, the term of this patent is extended or adjusted under 35 U.S.C. 154(b) by 0 days.

(21) Appl. No.: 18/718,900

(22) PCT Filed: Oct. 28, 2022

(86) PCT No.: PCT/CN2022/128312
§ 371 (c)(1),
(2) Date: Jun. 12, 2024

(87) PCT Pub. No.: WO2023/116197
PCT Pub. Date: Jun. 29, 2023

(65) Prior Publication Data
US 2025/0054455 A1    Feb. 13, 2025

(30) Foreign Application Priority Data
Dec. 23, 2021 (CN) .......................... 202111591964.4

(51) Int. Cl.
*G09G 3/34* (2006.01)
(52) U.S. Cl.
CPC ....... *G09G 3/3453* (2013.01); *G09G 2360/04* (2013.01); *G09G 2360/141* (2013.01)

(58) Field of Classification Search
CPC .... G02F 1/1334; G02F 1/13312; G02F 1/157; G02F 1/163; G02F 2201/44;
(Continued)

(56) References Cited

U.S. PATENT DOCUMENTS

2012/0050646 A1*  3/2012  Huang ................. G09G 3/3473
                                                        349/114
2020/0160775 A1*  5/2020  Zhang ............... G02F 1/133555
(Continued)

FOREIGN PATENT DOCUMENTS

CN     109856850 A     6/2019
CN     110488524 A    11/2019
(Continued)

OTHER PUBLICATIONS

WIPO, International Search Report issued on Jan. 28, 2023.

*Primary Examiner* — Priyank J Shah
(74) *Attorney, Agent, or Firm* — Li & Cai Intellectual Property (USA) Office

(57) ABSTRACT

Disclosed is a display panel, including a first display portion including a plurality of first pixel units, each of which includes a light-emitting element and a control element sequentially arranged in a thickness direction of the display panel, where the control element is configured to perform switching between a light-transmissive state and a light-shielding state under the control of an electric field, and the light-emitting element is configured to emit light under the control of a driving voltage. Further provided are a control method for the display panel, a control module for implementing the control method, and a display apparatus including the display panel.

7 Claims, 3 Drawing Sheets

(58) Field of Classification Search
CPC ........... G02F 1/133512; H04M 1/0264; H04N 23/57; G03B 17/18; G06F 1/1686
See application file for complete search history.

(56) References Cited

U.S. PATENT DOCUMENTS

| | | | |
|---|---|---|---|
| 2020/0319521 A1* | 10/2020 | Qin | ............................ G02F 1/15 |
| 2021/0076545 A1* | 3/2021 | Spencer | ................... G06F 1/163 |
| 2022/0137449 A1* | 5/2022 | Yang | ................. G02F 1/133531 |
| | | | 349/56 |

FOREIGN PATENT DOCUMENTS

| | | |
|---|---|---|
| CN | 110649074 A | 1/2020 |
| CN | 110928075 A | 3/2020 |
| CN | 112198694 A | 1/2021 |
| CN | 113744641 A | 12/2021 |
| JP | 2011013653 A | 1/2011 |

* cited by examiner

DISPLAY PANEL AND APPARATUS, CONTROL METHOD, AND CONTROL MODULE

CROSS-REFERENCE TO RELATED APPLICATIONS

[0001] The present disclosure is a National Phase Application filed under 35 U.S.C. 371 as a national stage of PCT/CN2022/128312, filed on Oct. 28, 2022 an application claiming the priority to Chinese Patent Application No 202111591964.4 led on Dec. 23, 2021 the contents of which are incorporated herein by reference in their entirety.

TECHNICAL FIELD

Embodiments of the present disclosure relate to the field of display technology, and specifically relate to a display panel, a control method for the display panel, a control module for implementing the control method, and a display apparatus including the display panel.

BACKGROUND

Currently, many display apparatuses (e.g., mobile phones, tablets) are provided with a front camera. In the display apparatus with the front camera, an area for the front camera is typically reserved on the display panel. For example, display panels such as a bangs screen, a waterdrop screen or the like are each provided with a dedicated area for arranging the front camera.

With the area reserved for the front camera, it seems impossible to implement full-screen display.

SUMMARY

Embodiments of the present disclosure provide a display panel, a control method for the display panel, a control module for implementing the control method, and a display apparatus including the display panel.

As a first aspect of the embodiments of the present disclosure, there is provided a display panel including a first display portion including a plurality of first pixel units, each of which includes a light-emitting element and a control element sequentially arranged in a thickness direction of the display panel, wherein the control element is configured to perform switching between a light-transmissive state and a light-shielding state under the control of an electric field, and the light-emitting element is configured to emit light under the control of a driving voltage.

As a second aspect of the embodiments of the present disclosure, there is provided a control method for a display panel, wherein the display panel is the display panel provided in the first aspect of the embodiments of the present disclosure, and the control method includes: providing, in response to a first photographing trigger signal, an electric field to each control element of the first display portion to enable the light-transmissive state of the control element; and providing, in response to a first photographing end signal, an electric field to each control element of the first display portion to enable the light-shielding state of the control element.

As a third aspect of the embodiments of the present disclosure, there is provided a control module, wherein the control module is configured to: provide, in response to a first photographing trigger signal, an electric field to each control element of the first display portion to enable the light-transmissive state of the control element; and provide, in response to a first photographing end signal, an electric field to each control element of the first display portion to enable the light-shielding state of the control element.

As a fourth aspect of the embodiments of the present disclosure, there is provided a display apparatus, including a display panel, a first camera and a control module, wherein the display panel includes a light-emitting surface and a backlight surface, and the display panel is the display panel provided in the first aspect of the embodiments of the present disclosure, the first camera is disposed at a position corresponding to the first display portion and facing to the backlight surface, and the control module is the control module provided in the third aspect of the embodiments of the present disclosure.

DETAIL DESCRIPTION OF EMBODIMENTS

To make those skilled in the art better understand the technical solutions in the embodiments of the present disclosure, the display panel and the display apparatus provided in the embodiments of the present disclosure will be described in detail below with reference to the accompanying drawings.

Exemplary embodiments will be described more sufficiently below with reference to the accompanying drawings, but which may be embodied in different forms and should not be construed as limited to the embodiments set forth herein. Rather, these embodiments are provided so that the present disclosure will be thorough and complete, and will fully convey the scope of the present disclosure to those skilled in the art.

The embodiments of the present disclosure and features thereof may be combined with each other as long as they are not contradictory.

As used herein, the term "and/or" includes any and all combinations of one or more of the associated listed items.

The terminology used herein is for the purpose of describing specific embodiments only and is not intended to limit the present disclosure. As used herein, the singular forms "a", "an" and "the" are intended to include the plural forms as well, unless the context clearly indicates otherwise. It will be further understood that as used herein, the terms "comprise" and/or "consist of . . . " specify the presence of stated features, integers, steps, operations, elements, and/or components, but do not preclude the presence or addition of one or more other features, integers, steps, operations, elements, components, and/or groups thereof.

Unless otherwise defined, all terms (including technical terms and scientific terms) used herein have the same meaning as commonly understood by one of ordinary skill in the art. It will be further understood that terms, such as those defined in commonly used dictionaries, should be interpreted as having a meaning that is consistent with their meaning in the context of the existing art and the embodiments of the present disclosure, and will not be interpreted in an idealized or overly formal sense unless expressly so defined herein.

Figure 1:
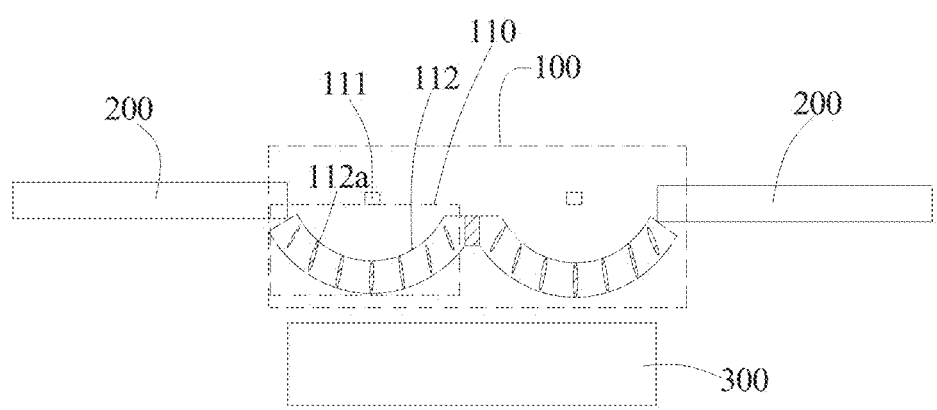
FIG. 1 is a schematic diagram of an implementation of a display apparatus according to an embodiment of the present disclosure.

As a first aspect of the embodiments of the present disclosure, there is provided a display panel. As shown in FIG. 1, the display panel includes a first display portion 100 including a plurality of first pixel units 110. Each first pixel unit 110 includes a light-emitting element 111 and a control element 112 sequentially arranged in a thickness direction (the vertical direction in FIG. 1) of the display panel. The control element 112 is configured to perform switching between a light-transmissive state (FIGS. 1, 2 and 5) and a light-shielding state (FIGS. 3 and 4) under the control of an electric field, and the light-emitting element 111 is configured to emit light under the control of a driving voltage.

Figure 4:
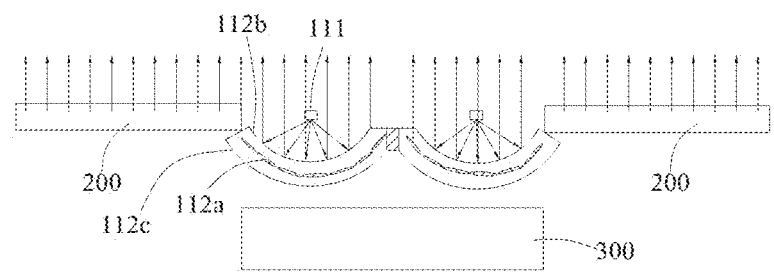
FIG. 4 is a schematic diagram showing a light-emitting state of the display panel when the control element is in the light-shielding state according to an embodiment of the present disclosure.

It should be noted that the display panel is used in a display apparatus including a first camera 300, the first camera 300 is disposed corresponding to the first display portion 100, and positioned on a backlight side of the display panel. To use the first camera 300, an electric field capable of enabling the light-transmissive state of the control element 112 may be applied to the control element 112, so that light outside the display panel can enter the first camera 300 (FIG. 5) through the control element 112, thereby implementing photographing by the first camera 300. When the first camera 300 is not used for photographing, an electric field capable of enabling the light-shielding state of the control element 112 may be applied to the control element 112, so that the first camera 300 is invisible to a user on a light-emitting side of the display panel. Since the first pixel unit 110 is further provided with the light-emitting element 111, and display of different gray scales may be implemented by controlling the luminance of the light-emitting element 111, the first display portion 100 of the display panel can normally display when the control element 112 is in the light-shielding state (FIG. 4). In other words, the display panel can realize full-screen display when the first camera is not in use.

The specific structure of the control element 112 is not particularly defined in the embodiments of the present disclosure. For example, the control element 112 may be a liquid crystal cell in which liquid crystal molecules are deflected by an electric field, so that the liquid crystal cell can be switched between the light-transmissive state and the light-shielding state.

For example, for a normally-black liquid crystal material, the control element 112 is in the light-shielding state when no electric field is applied to the control element 112. When an electric field of a predetermined intensity is applied to the control element 112, liquid crystal molecules in the control element 112 are deflected so that the control element 112 enters the light-transmissive state.

For another example, for a normally-white liquid crystal material, the control element 112 is in the light-transmissive state when no electric field is applied to the control element 112. When an electric field of a predetermined intensity is applied to the control element 112, liquid crystal molecules in the control element 112 are deflected so that the control element 112 enters the light-shielding state.

Figure 2:
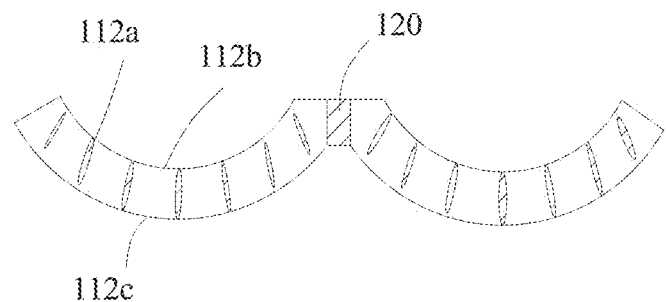
FIG. 2 is a schematic diagram of a control element in a light-transmissive state according to an embodiment of the present disclosure.
Figure 3:
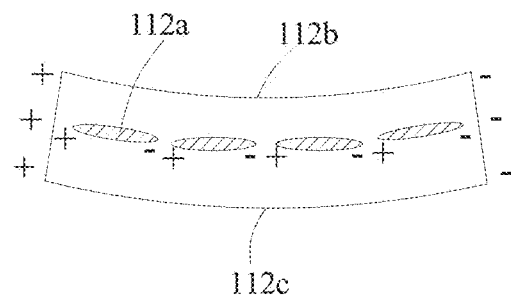
FIG. 3 is a schematic diagram of a control element in a light-shielding state according to an embodiment of the present disclosure.

Apparently, the embodiments of the present disclosure are not limited thereto. As an alternative implementation, as shown in FIGS. 2 and 3, the control element 112 includes a polar material layer including a plurality of opaque polar particles 112a each having a greater dimension in a length direction than in other directions. In other words, each polar particle 112a may have a rod-like or needle-like structure, or may have any other elongated structure.

In this implementation, as shown in FIG. 3, each polar particle 112a has different polarities at two ends so that the polar particle 112a is rotatable under action of an electric field to the extent of enabling the light-shielding state of the control element 112, and so that the polar particle 112a is also rotatable under action of an electric field to the extent of enabling the light-transmissive state of the control element 112.

Other parts of the control element 112 are not particularly defined in the embodiments of the present disclosure. For example, the control element 112 may further include a first substrate 112b and a second substrate 112c disposed opposite to each other, and the polar material layer is positioned between the first substrate 112b and the second substrate 112c.

As shown in FIG. 2, in the light-transmissive state, the length direction of the polar particles 112a coincides with the thickness direction of the control element 112, so that light passes through intervals between the polar particles 112a. As shown in FIG. 3, in the light-shielding state, the length direction of the polar particles 112a is perpendicular to the thickness direction of the control element 112, so that light can be blocked.

Figure 5:
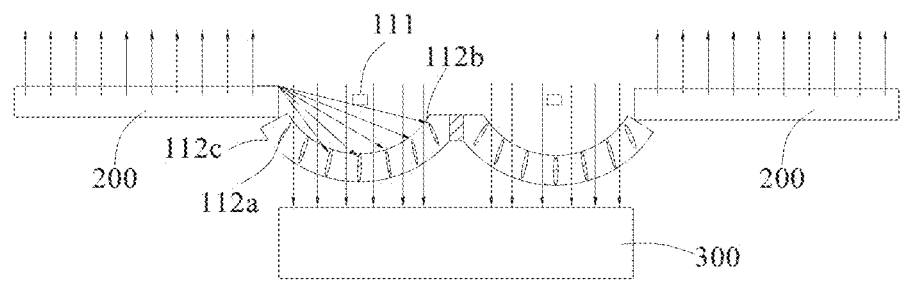
FIG. 5 is a schematic diagram showing a light-emitting state of the display panel when the control element is in the light-transmissive state according to an embodiment of the present disclosure.

As described above, the first pixel unit 110 further includes the light-emitting element 111, and in the embodiments of the present disclosure, the specific structure of the light-emitting element 111 is not particularly limited. For example, the light-emitting element 111 may be an organic light-emitting diode (OLED). To enable uniform emission across the first pixel unit 110 and improve the display quality in the first display portion, optionally, as shown in FIGS. 3, 4 and 5, the first substrate 112b is positioned between the light-emitting element 111 and the second substrate 112c, and a surface of the first substrate 112b facing the light-emitting element 111 is a concave surface. As shown in FIG. 4, when the control element 112 is in the light-shielding state, the surface of the first substrate 112b forms a concave mirror, and light emitted by the light-emitting element 111 is uniformly reflected outward after irradiating on the concave surface of the first substrate 112b, so that the point light source of the light-emitting element 111 can be converted into a surface light source, thereby providing uniform emission of the first pixel unit 110, and improving the display quality in the first display portion 100.

To further improve the emission uniformity of the first pixel unit 110, optionally, the polar particle 112a includes a particle body and a light-reflecting layer covering the particle body.

When the light-emitting element 111 emits light, the light irradiates on the light-reflecting layer of the polar particle 112a, and then is reflected toward the light-emitting surface of the display panel.

As an alternative implementation, the concave surface of the first substrate 112b is an arcuate surface, and the light-emitting element 111 is disposed at a focus of the concave mirror formed by the concave surface of the first substrate 112*b*, so that light emitted from the light-emitting element 111 towards the concave surface can be converted into parallel light, and the luminance uniformity of the first pixel unit 110 can be improved.

How to dispose the light-emitting element 111 in the concave space of the first substrate 112*b* is not particularly limited in the embodiments of the present disclosure. For example, a transparent resin material may be filled on the concave surface of the first substrate 112*b*, and then the light-emitting element 111 may be disposed on the transparent resin material. For another example, any other supporting element capable of supporting the light-emitting element 111 may be provided as long as the light-emitting element 111 can be disposed in the space corresponding to the concave surface of the first substrate 112*b*.

To improve the display effect and prevent the color cross between adjacent first pixel units 110, optionally, a light-blocking member 120 is provided between two adjacent first pixel units 110.

The specific material of the light-blocking member 120 is not particularly limited in the embodiments of the present disclosure. For example, the light-blocking member 120 may be made of a resin material doped with carbon black.

A proportion of the first display portion 100 in the display panel is not particularly limited in the embodiments of the present disclosure. As an alternative implementation, the first display portion includes the whole display area of the display panel. As another alternative implementation, the display panel further includes a second display portion 200 including a plurality of second pixel units. It should be noted that each second pixel unit is a conventional pixel unit. For example, the second pixel unit may be a pixel unit including an OLED, or a liquid crystal pixel unit.

FIG. 5 is a schematic diagram showing a light-emitting state of the display panel when the control element 112 is in the light-transmissive state. In FIG. 5, the upward arrows indicate display light emitted from the second display portion 200 of the display panel for display. The downward arrows indicate ambient light (including light reflected by the object being photographed), which passes through intervals between the polar particles 112*a* to reach the first camera 300. As described above, an outer surface of the polar particle 112*a* is a light-reflecting surface, and when the second pixel units emit light, the light will irradiate on the light-reflecting surface of the polar particle 112*a* to be reflected, so that interference caused by the emitting light of the second pixel units around the second display portion 200 is prevented when the first camera 300 is used for photographing.

In the embodiments of the present disclosure, the relative positional relationship between the first display portion 100 and the second display portion 200 is not particularly limited, and optionally, the second display portion 200 is disposed around the first display portion 100.

To improve the overall display effect of the display panel, optionally, the first pixel units 110 in the first display portion 100 are arranged in the same density as the second pixel units in the second display portion 200.

Figure 6:
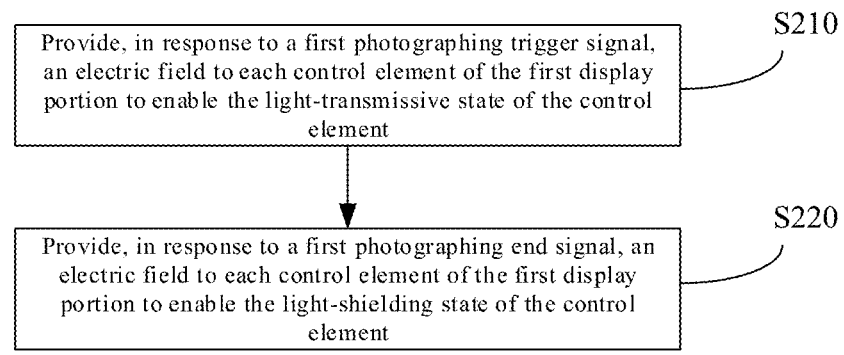
FIG. 6 is a flowchart of an implementation of a control method according to an embodiment of the present disclosure.

As a second aspect of the embodiments of the present disclosure, there is provided a control method for a display panel, where the display panel is the display panel provided in the above embodiments of the present disclosure. As shown in FIG. 6, the control method includes the following operations S210 to S220.

At operation S210, providing, in response to a first photographing trigger signal, an electric field to each control element of the first display portion to enable the light-transmissive state of the control element.

At operation S220, providing, in response to a first photographing end signal, an electric field to each control element of the first display portion to enable the light-shielding state of the control element.

The "first photographing trigger signal" here refers to a signal capable of triggering photographing by the first camera, which may be a signal provided to the first camera by a user through an input device such as a touch panel, a control key, or the like. When the first photographing trigger signal is received, an electric field may be provided to each control element of the first display portion to enable the light-transmissive state of the control element, so that the control element and the first display portion are in the light-transmissive state as a whole, and ambient light can reach the first camera through the first display portion.

The "first photographing end signal" here is a signal indicating that the photographing by the first camera is ended. A user may also generate the first photographing end signal through an input device such as a touch panel, a control key, or the like. When the first photographing end signal is received, an electric field may be provided to each control element of the first display portion to enable the light-shielding state of the control element, so that the control element may shield the first camera to recover a normal display function of the first display portion.

As a third aspect of the embodiments of the present disclosure, there is provided a control module, where the control module is configured to control the display panel provided in the first aspect of the embodiments of the present disclosure, and the control module is configured to: provide, in response to a first photographing trigger signal, an electric field to each control element of the first display portion to enable the light-transmissive state of the control element; and provide, in response to a first photographing end signal, an electric field to each control element of the first display portion to enable the light-shielding state of the control element.

As a fourth aspect of the embodiments of the present disclosure, there is provided a display apparatus, including a display panel, a first camera 300 and a control module. The display panel includes a light-emitting surface and a backlight surface. The display panel is the display panel provided in the first aspect of the embodiments of the present disclosure. The first camera 300 is disposed at a position corresponding to the first display portion 100 and facing to the backlight surface. The control module is the control module provided in the third aspect of the embodiments of the present disclosure.

As described above, to use the first camera 300 for photographing, the control module may apply an electric field capable of enabling the light-transmissive state of the control element 112 to the control element 112, so that light outside the display panel can enter the first camera 300 through the control element 112, thereby implementing photographing by the first camera 300. When the first camera 300 is not used for photographing, the control module may apply an electric field capable of enabling the light-shielding state of the control element 112 to the control element 112, so that the first camera 300 is invisible to a user on a light-emitting side of the display panel. Since the first pixel unit 110 is further provided with a light-emitting element 111, and display of different gray scales may be implemented by controlling the luminance of the light-emitting element 111, the first display portion 100 of the display panel can normally display when the control element 112 is in the light-shielding state. In other words, the display panel can realize full-screen display when the first camera is not in use.

Optionally, the display apparatus may further include a second camera serving as a rear camera.

In the embodiments of the present disclosure, how to provide the electric field for the control element is not particularly limited, and optionally, the display apparatus includes an electric field providing module configured to provide the electric field for the control element.

The present disclosure has disclosed exemplary embodiments, and although specific terms are employed, they are used and should be interpreted merely in a generic and descriptive sense, not for purposes of limitation. In some instances, as would be apparent to one skilled in the art, features, characteristics and/or elements described in connection with a particular embodiment may be used alone or in combination with features, characteristics and/or elements described in connection with another embodiment, unless expressly stated otherwise. It will, therefore, be understood by those skilled in the art that various changes in form and details may be made therein without departing from the scope of the present disclosure as set forth in the appended claims.

What is claimed is:

1. A display panel, comprising a first display portion comprising a plurality of first pixel units, each of which comprises a light-emitting element and a control element sequentially arranged in a thickness direction of the display panel, wherein the control element is configured to perform switching between a light-transmissive state and a light-shielding state under the control of an electric field, and the light-emitting element is configured to emit light under the control of a driving voltage, wherein the control element comprises a first substrate and a second substrate disposed opposite to each other, and a polar material layer positioned between the first substrate and the second substrate, wherein the polar material layer comprises a plurality of opaque polar particles each having a greater dimension in a length direction than in other directions, and each polar particle has different polarities at two ends so that the polar particle is rotatable under action of an electric field to the extent of enabling the light-shielding state of the control element, and so that the polar particle is also rotatable under action of an electric field to the extent of enabling the light-transmissive state of the control element, wherein the first substrate is positioned between the light-emitting element and the second substrate, and a surface of the first substrate facing the light-emitting element is a concave surface.

2. The display panel according to claim 1, wherein the polar particle comprises a particle body and a light-reflecting layer covering the particle body.

3. The display panel according to claim 1, wherein a light-blocking member is provided between two adjacent first pixel units.

4. The display panel according to claim 1, wherein the display panel further comprises a second display portion comprising a plurality of second pixel units.

5. A control method for a display panel, wherein the display panel is the display panel according to claim 1, and the control method comprises:

providing, in response to a first photographing trigger signal, an electric field to each control element of the first display portion to enable the light-transmissive state of the control element; and providing, in response to a first photographing end signal, an electric field to each control element of the first display portion to enable the light-shielding state of the control element.

6. A control module, wherein the control module is configured to control the display panel according to claim 1, and the control module is configured to:

provide, in response to a first photographing trigger signal, an electric field to each control element of the first display portion to enable the light-transmissive state of the control element; and provide, in response to a first photographing end signal, an electric field to each control element of the first display portion to enable the light-shielding state of the control element.

7. A display apparatus, comprising a display panel, a first camera and a control module, wherein the display panel comprises a light-emitting surface and a backlight surface, and the display panel is the display panel according to claim 1, the first camera is disposed at a position corresponding to the first display portion and facing to the backlight surface, and the control module is configured to control the display panel, and the control module is configured to:

provide, in response to a first photographing trigger signal, an electric field to each control element of the first display portion to enable the light-transmissive state of the control element; and provide, in response to a first photographing end signal, an electric field to each control element of the first display portion to enable the light-shielding state of the control element.

* * * * *